United States Patent [19]

Schachameyer et al.

[11] Patent Number: 4,940,505
[45] Date of Patent: Jul. 10, 1990

[54] METHOD FOR GROWING SINGLE CRYSTALLINE SILICON WITH INTERMEDIATE BONDING AGENT AND COMBINED THERMAL AND PHOTOLYTIC ACTIVATION

[75] Inventors: Steven R. Schachameyer, Whitefish Bay; Mark W. Beranek, Grafton, both of Wis.

[73] Assignee: Eaton Corporation, Cleveland, Ohio

[21] Appl. No.: 279,566

[22] Filed: Dec. 2, 1988

[51] Int. Cl.$^5$ .................................... H01L 21/205
[52] U.S. Cl. ......................... 156/612; 148/DIG. 17; 148/DIG. 48; 427/38; 427/53.1; 437/85; 437/88; 437/173; 437/946
[58] Field of Search ............... 437/173, 946, 85, 88; 156/612; 148/DIG. 17, DIG. 48; 427/38, 53.1

[56] References Cited

U.S. PATENT DOCUMENTS

| | | | |
|---|---|---|---|
| 4,260,649 | 4/1981 | Dension et al. | 427/53.1 |
| 4,292,093 | 9/1981 | Ownby et al. | 148/4 |
| 4,340,617 | 7/1982 | Deutsch et al. | 427/53.1 |
| 4,435,445 | 3/1984 | Allred et al. | 427/54.1 |
| 4,495,218 | 1/1985 | Azuma et al. | 427/53.1 |
| 4,529,475 | 7/1985 | Okano et al. | 156/643 |
| 4,529,617 | 7/1985 | Chenevas-Paule et al. | 427/53.1 |
| 4,579,609 | 4/1986 | Reif et al. | 148/175 |
| 4,579,750 | 4/1986 | Bowen et al. | 427/53.1 |
| 4,590,091 | 5/1986 | Rogers, Jr. et al. | 427/53.1 |
| 4,624,736 | 11/1986 | Gee et al. | 156/643 |
| 4,655,849 | 4/1987 | Schachameyer et al. | 148/1.5 |
| 4,668,304 | 5/1987 | Schachameyer et al. | 148/1.5 |
| 4,670,063 | 6/1987 | Schachameyer et al. | 148/1.5 |
| 4,670,064 | 6/1987 | Schachameyer et al. | 148/1.5 |
| 4,685,976 | 8/1987 | Schachameyer et al. | 437/173 |
| 4,732,793 | 3/1988 | Itoh | 427/53.1 |
| 4,843,030 | 6/1989 | Eden et al. | 437/88 |

OTHER PUBLICATIONS

"Low Temperature Growth of Polycrystalline Si and Ge Films by Ultraviolet Laser Photodissociation of Silane and Germane" R. W. Andreatta et al., Appl. Phys. Lett. 40(2), 1982, 183–185.

"Activation Energy and Spectroscopy of the Growth of Germanium Films by Ultraviolet Laser-Assisted Chemical Vapor Deposition", Osmundsen et al., Journal of Applied Physics, vol. 57, #8, Part 1, Apr. 1985, pp. 2921–2930.

(List continued on next page.)

Primary Examiner—Melvyn J. Andrews
Attorney, Agent, or Firm—Andrus, Sceales, Starke & Sawall

[57] ABSTRACT

A method is provided for epitaxially growing single crystalline silicon on a silicon substrate (10) from a silicon-bearing gas (26) at a temperature below the pyrolytic threshold of the gas and at temperatures below those normally required for epitaxial growth. An oxidized silicon substrate (10) is fluorinated (equation 2, FIG. 2) to replace the silicon-oxide layer with an adsorbed fluorinated layer. The substrate is placed in a laser photo-CVD reactor chamber (20), the chamber is evacuated to a sub-UHV level of $10^{-3}$ to $10^{-7}$ Torr, the substrate is heated to 570° C., hydrogen gas (24) is introduced into the chamber, and excimer pulsed ultraviolet laser radiation (32 from laser 12) is applied through the hydrogen gas to impinge the wafer substrate. The combined effect removes regrown native oxide and removes the adsorbed fluorinated layer and breaks the hydrogen into atomic hydrogen such that the latter bonds with the silicon in the substrate and replaces the adsorbed fluorinated layer with silicon-hydrogen bonds (equation 4, FIG. 2). The substrate is maintained at 570° C. and disilane is introduced into the chamber, and excimer pulsed ultraviolet laser radiation is applied through the disilane gas to impinge the wafer substrate. The combined effect breaks the silicon-hydrogen bond and decomposes the disilane to silane and an unstable intermediate $SiH_2$ which decomposes to hydrogen and atomic silicon (equation 5, FIG. 2), which atomic silicon bonds to the now unbonded silicon in the substrate to epitaxially grow single crystalline silicon.

9 Claims, 1 Drawing Sheet

OTHER PUBLICATIONS

"Laser-Assisted Chemical Vapor Deposition of Si: Low-Temperature (600° C.) Growth of Epitaxial and Polycrystalline Layer", K. Suzuki et al., Jour. Appl. Phys. 58(2), 1985, pp. 979-982.

"Characterization of Photochemical Processing", M. Hirose et al., Jour. Vac. Sci. Technol B., vol. 3, No. 5, 1985, pp. 1445-1449.

"Excimer Laser Enhanced Silicon Epitaxial Growth with in Situ Surface Cleaning" Ishitani et al., 1985 Extended Abstracts, Materials Research Society 1985 Fall Meeting, Beam-Induced Chemical Processes, pp. 51-53.

"Epitaxial Growth of Silicon by Photochemical Vapor Deposition at a Very Low Temperature of 200° C.", S. Nishida et al., Appl. Phys. Lett. 49(2), 1986, pp. 79-81.

"Laser Photochemical Vapor Deposition of Ge Films ($300 \leq T \leq 873°$ K.) From GeH$_4$: Roles of Ge$_2$H$_6$ and Ge", K. K. King et al., Mat. Res. Soc. Symp. Proc., vol. 75, 1987, pp. 189-193.

"Epitaxial Growth of Ge Films on GaAs (285°-415° C.) by Laser Photochemical Vapor Deposition", Tavitian et al., Appl. Phys. Letters 52(20), 1988, pp. 1710-1712.

(1) $Si + O_x \xrightarrow{AMBIENT} SiO_x$ (2) $SiO_x + nHF \xrightarrow{FLUORINATED} SiF_yH_z + O_x$ (3) $SiF_yH_z + O_x \xrightarrow{AMBIENT} SiF_yO_xH_z$ (4) $SiF_yO_xH_z + H_2 \xrightarrow[THERMAL + PHOTOLYTIC]{570°C + \mu r\ 193\ nm} SiH_z + 2HF + nO_2$ (5) $SiH_z + Si_2H_6 \xrightarrow[THERMAL + PHOTOLYTIC]{570°C + \mu r\ 193\ nm} Si + SiH_z + SiH_4$ $\xrightarrow[THERMAL + PHOTOLYTIC]{570°C + \mu r\ 193\ nm} Si-Si(EPI) + H_2 + SiH_4$

METHOD FOR GROWING SINGLE CRYSTALLINE SILICON WITH INTERMEDIATE BONDING AGENT AND COMBINED THERMAL AND PHOTOLYTIC ACTIVATION

BACKGROUND AND SUMMARY

The invention provide a method for epitaxially growing single crystalline silicon on a silicon substrate from a silicon-bearing gas at a temperature below the pyrolytic threshold of the gas and at temperatures below those normally required for epitaxial growth.

Low temperature, e.g. 400° C., deposition and epitaxial growth of single crystalline silicon is known in the art, for example Schachameyer et al U.S. Pat. Nos. 4,655,849, 4,668,304, 4,670,063, 4,670,064, 4,685,976, incorporated herein by reference. Such low temperature is significantly below typical thermal processing temperatures of 1000° C. In the latter type of processing, the silicon-bearing gas is heated above its pyrolytic threshold such that the gas thermally decomposes.

The present invention uses a combination of both thermal and photolytic activation of a siliconbearing gas to epitaxially grow single crystalline silicon. In the preferred embodiment, the process is carried out at 570° C. This temperature is well below the temperature normally required for epitaxial growth, and thus avoids deleterious high temperature effects on the wafer substrate. Such temperature is above the strictly photolytic range, whereby to provide some of the beneficial effects of thermal processing.

The invention also involves the use of one or more intermediate substitute bonding agents which replace the silicon-oxygen bond of an oxidized silicon wafer substrate with one or more intermediate substitute bonds which are readily processed and ultimately replaced by a silicon-silicon bond as the silicon-bearing gas is thermally and photolytically decomposed to yield atomic silicon.

In the preferred embodiment, an oxidized silicon wafer substrate is fluorinated by immersing it in a solution of dilute hydrofluoric acid. This removes the oxide layer and substitutes an adsorbed fluorinated layer for the silicon-oxygen bond. The wafer substrate is then placed in a photo-CVD (chemical vapor deposition) chamber, and the chamber is evacuated to a sub-UHV (ultra high vacuum) level of $10^{-3}$ to $10^{-7}$ Torr. Hydrogen gas is introduced into the chamber, and excimer pulsed ultraviolet laser radiation is applied through the gas and against the substrate, generally perpendicularly thereto. The radiation photolytically removes the fluorinated layer and reduces the hydrogen to atomic hydrogen such that a silicon-hydrogen bond forms in place of the fluorinated layer. During this step, the wafer substrate is optionally heated to a temperature of about 570° C., which thermally aids the reaction. Disilane gas is then introduced into the chamber, and, if not already heated, the wafer substrate is heated to a temperature of about 570° C. Excimer pulsed ultraviolet laser radiation is applied through the gas and against the substrate, generally perpendicularly thereto. The thermal activation by the heating and the photolytic activation by the laser radiation in combination breaks the silicon-hydrogen bond and also decomposes the disilane gas to silane and an unstable intermediate compound $SiH_z$ which decomposes to hydrogen and atomic silicon. The atomic silicon bonds with the now unbonded silicon in the substrate to epitaxially grow single crystalline silicon thereon.

DETAILED DESCRIPTION

Figure 1:
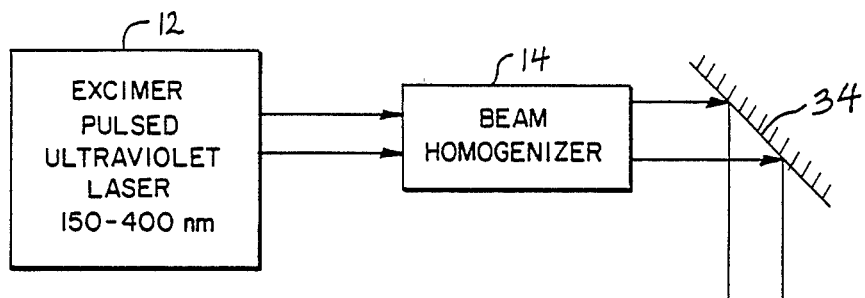
FIG. 1 illustrates the semiconductor processing technique in accordance with the invention.

FIG. 1 illustrates a method for epitaxially growing single crystalline silicon on a silicon wafer substrate 10. Excimer pulsed ultraviolet laser radiation is provided by laser 12 and homogenized by beam homogenizer 14. Substrate 10 is placed on a supporting susceptor pedestal 16 on resistance heater 18 in processing chamber 20, which is a conventional laser photo-CVD (chemical vapor deposition) reactor chamber. Reactant gas is introduced into chamber 20 at port 22 from sources 24 and 26, and is exhausted at port 28, all as is conventional. Chamber 10 typically has an inert gas purge window or port 30 through which excimer pulsed ultraviolet laser radiation from laser 12 through homogenizer 14 is introduced into chamber 20 along path 32 as directed by mirror 34 to impinge substrate 10 substantially perpendicularly thereto. The above noted incorporated patents show various available excimer pulsed ultraviolet laser radiation wavelengths and peak power, and an absorption spectrum of a reactant gas with absorption peaks at discrete designated excitation energy wavelengths. The excimer radiation wavelength is chosen according to the reactant gas absorption peaks, or vice versa, as noted in said patents.

Figure 2:
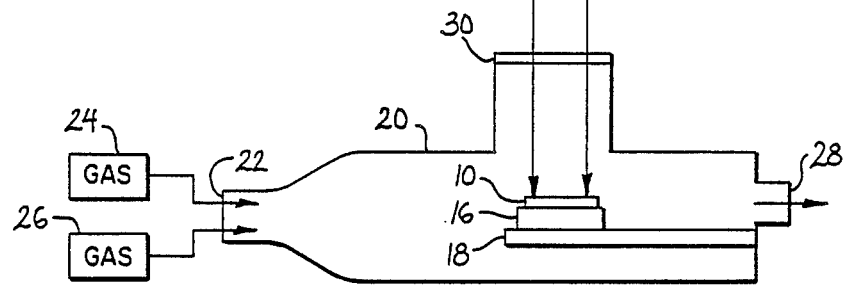
FIG. 2 shows the chemical equations for the semiconductor processing technique in accordance with the preferred embodiment of the invention.

The initial step in the process involves wet chemical cleaning, oxide removal and surface fluorination. Prior to loading silicon wafer substrate 10 into chamber 20, the wafer substrate is cleaned to remove both organic and metal contaminants and native oxide, $SiO_x$, $x=1, 2$, which are present on the wafer surface upon exposure to ambient, i.e. room air. The known RCA clean recipe is employed to remove the organic and metal contaminants. The native oxide is stripped from the surface by dipping the wafer in dilute nHF, hydrofluoric acid, where n = an integer or a fraction thereof, effectively dissolving the $SiO_x$, leaving behind a largely fluorinated surface, $SiF_yH_z$ where y and z equal 1, 2, 3 or fractions thereof. This is illustrated at equations (1) and (2), FIG. 2. Fluorine has a stronger affinity to silicon than the affinity of oxygen to silicon.

The next step in the process involves dry, hydrogen reduction and/or surface halogenation with volatilization of regrown native oxide and photoinduced desorption of residual and/or reformed organic contamination. The wafer substrate is loaded into chamber 20 and cleaned once again using a low temperature uv, ultraviolet laser enhanced process. Native oxide may regrow on the substrate surface upon exposure to ambient room air between the dilute HF dip noted above and placement in chamber 20 and evacuated pump down thereof, equation (3), FIG. 2. This regrown native oxide film is removed by a photon enhanced hydrogen reduction process, to be described. Additionally, reformed organic contamination is volatilized during this step.

Reactor chamber 20 is evacuated, to be described, and substrate 10 is heated to 570° C. Hydrogen gas is then flowed through the reactor from source 24 to a pressure of 20 Torr for 7 minutes. A 193 nm (nanometer), excimer laser 12 is then turned on, irradiating the surface of the silicon substrate at an intensity of 5 millijoules per square centimeter at 10 Hz for 3 minutes. Upon completion of this step, the substrate's surface is extremely clean and oxide-free, and a partially hydrogenated, $SiH_z$, surface has now formed, equation (4), FIG. 2. The laser radiation removes the oxide layer. The combined thermal and photolytic activation breaks the silicon-fluorine bond and removes the fluorinated layer and reduces the hydrogen to atomic hydrogen such that the latter bonds with the silicon and forms a silicon-hydrogen bond to replace the silicon-fluorine bond and the fluorinated layer. In an alternative embodiment, the wafer substrate need not be heated, in which case the reaction relies upon photolytic activation by the laser radiation to break the silicon-fluorine bond and remove the fluorinated layer and reduce the hydrogen to atomic hydrogen. In a further alternative embodiment, the wafer substrate is heated to a different temperature to vary the thermal contribution to activation of the reaction.

The next step involves low temperature deposition of epitaxial silicon promoted by laser photolysis of disilane gas in a low pressure hydrogen atmosphere and laser enhanced desorption of hydrogen and laser enhanced adatom, silicon, mobility at the growing silicon surface. The substrate is maintained at 570° C., and a dilute 5% mixture of disilane in hydrogen is flowed through the chamber at a pressure of 10 Torr. The laser 12 continues to irradiate the substrate as the film is grown. Film thickness is determined by the total time of this step. Deposition rate is controlled by the laser fluence, total reactor pressure and partial pressure of disilane in the reactor. The 193 nm laser 12 irradiates both the surface of substrate 10 and the disilane atmosphere above the surface of the substrate. The disilane gas photodissociates, forming silicon-containing intermediates which subsequently decompose, forming a silicon film at the substrate surface. As shown in equation (5), FIG. 2, the combined thermal and photolytic activation breaks the silicon-hydrogen bond and also decomposes the disilane $Si_2H_6$ to silane $SiH_4$ and an unstable intermediate $SiH_z$, which latter then decomposes to hydrogen $H_2$ and atomic silicon Si. The atomic silicon bonds with the now unbonded silicon in the wafer substrate to epitaxially grow single crystalline silicon thereon. Gas flow is ceased, and the substrate is cooled to room temperature either under vacuum or an inert gas atmosphere, He, Ar or $N_2$ Typically, during processing in a photo-CVD reactor chamber such as 20, it is desirable to evacuate the chamber to levels approaching ultra high vacuum (UHV) conditions, $10^{-9}$ Torr and less. At this level, practically all residual water, air and organic gases are removed from the reactor chamber Under these conditions, the only contaminants which must be volatilized are the regrown native oxide and chemi/physisorbed organics. External heating of the entire reactor and the silicon wafer itself enables the adsorbed gases to more readily desorb, effectively reducing the time required to evacuate the reactor to UHV levels. However, a high temperature (greater than 750° C.) cleaning or etching process is still required to volatized the native oxide and organic contamination.

The present invention does not require UHV conditions. This is particularly desirable, because obtaining UHV conditions is expensive and time consuming, especially when compared to the dry, laser driven hydrogen reduction cleaning process described above and illustrated at equation (4), FIG. 2. Also, the wafer does not have to be heated to temperatures is typically required to volatilize the oxide. For example, at atmospheric pressure with no vacuum 1200° C. is typically required to clean the surface. At ultra high vacuum levels, e.g. $10^{-9}$ Torr, temperatures of 800° C. are typically required to clean the wafer. In the present process, temperatures of only 570° C. are used to clean the wafer. After evacuating the chamber to sub-UHV levels, $10^{-3}$ to $10^{-7}$ Torr, the silicon substrate is heated to 570° C. in a flowing hydrogen atmosphere. The combined effect of irradiating the substrate with 193 nm laser radiation and the thermal activation in the hydrogen atmosphere decreases the cleaning time significantly. The hydrogen serves several purposes. Its presence in the reactor chamber prevents further oxidation of the substrate by gases desorbing from the reactor chamber walls, and aids in volatizing chemi/physisorbed contaminants on the wafer substrate surface. Since the substrate is largely fluorinated, the HF or atomic hydrogen H or atomic fluorine F produced at the surface can effectively etch regrown native oxide. Any trace oxygen in the reactor chamber is converted to ozone which can also react with other organic contamination, forming a volatile product which is pumped away. The resultant hydrogenated silicon surface is sufficiently contaminant free to accommodate homoepitaxial silicon deposition at 570° C. as illustrated at equation (5), FIG. 2.

The deep uv laser radiation enhances the desorption of the contaminants via reactive photodesorption, laser induced thermal desorption and photochemical dry etching mechanisms, the sum of which produces the required pristine silicon surface. The deep uv laser radiation, 193 nm, 6.44 eV, is absorbed by the disilane, producing a population of metastable intermediates $SiH_z$ at or near the substrate surface. These intermediates can decompose at the hot silicon surface, or recombine to form various silane derivatives, or combine with hydrogen forming a volatile product. The products formed near the silicon surface can either decompose to form a film or be pumped away. The exact mechanism is not known, however the resulting film produced at 570° C. is homoepitaxial. The intermediate products ultimately converted to the silicon film can gain enhanced adatom mobility through absorption of the uv radiation, increasing the probability that the atom finally resides at a preferred site for epitaxial growth. The laser enhances the desorption of hydrogen at the silicon surface, especially in the presence of the unstable disilane photodissociation products, effectively reducing undesired hydrogen entrapment as is produced in very low temperature amorphous hydrogenated silicon films. The 570° C. substrate temperature provides sufficient thermal energy to decompose the intermediate responsible for silicon film growth, enhance silicon adatom mobility and enhance desorption of the reaction products.

It is recognized that various equivalents, alternatives and modifications are possible within the scope of the appended claims.

We claim:

1. A method for epitaxially growing single crystalline silicon on a silicon substrate from a silicon-bearing gas at a temperature below the pyrolytic threshold of said silicon-bearing gas, comprising:

providing a silicon substrate exposed to ambient to have an oxide layer thereon;

removing the oxide layer and substituting therefore a first intermediate bonding agent bonding with silicon atoms in the substrate in place of oxygen;

removing said first bonding agent and substituting therefore a second bonding agent bonding with silicon atoms in said substrate in place of said first bonding agent;

removing said second bonding agent in the presence of silicon-bearing gas and substituting atomic silicon from said gas for said second bonding agent to bond with silicon atoms in said substrate and epitaxially grow single crystalline silicon on said substrate;

wherein:

said step of removing said first bonding agent and substituting therefore said second bonding agent is photolytically activated comprising applying laser radiation against said substrate;

said step of removing said second bonding agent and substituting therefore atomic silicon from said silicon-bearing gas is both thermally and photolytically activated comprising in combination heating said substrate and applying laser radiation against said substrate;

and comprising:

after said step of removing said oxide layer and substituting therefore said first bonding agent, exposing said substrate to ambient such that another layer of oxide forms thereon;

removing said other oxide layer during said step of removing said first bonding agent and substituting therefore said second bonding agent by said photolytic activation;

without exposing said substrate to ambient, continuing the process by removing said second bonding agent and substituting therefore said atomic silicon from said silicon-bearing gas by said combined thermal and photolytic activation.

2. A method for epitaxially growing single crystalline silicon on a silicon substrate from a semiconductor-bearing gas at a temperature below the pyrolytic threshold of said siliconbearing gas, comprising:

providing a silicon substrate exposed to ambient to have an oxide layer thereon;

exposing said substrate to a first atmosphere having a first bonding agent with a stronger bonding affinity to silicon than the bonding affinity of oxygen to silicon, to replace the silicon-oxide bonds;

exposing said substrate to a second atmosphere having a second bonding agent with a bonding affinity to silicon;

applying laser radiation against said substrate in the presence of said second atmosphere to break the bond between the silicon and the first bonding agent and replace it with a bond between the silicon and the second bonding agent;

without exposing said substrate to ambient, exposing said substrate to a third atmosphere having a silicon-bearing gas;

heating said substrate in the presence of said third atmosphere to a temperature below the pyrolytic threshold of said silicon-bearing gas;

applying laser radiation against said substrate while heated and in the presence of said third atmosphere to break the bond between the silicon and the second bonding agent and to break the bonds in the silicon-bearing gas to decompose the latter to atomic silicon which bonds with the new unbonded silicon atoms in said substrate to epitaxially grow single crystalline silicon thereon;

exposing said substrate to ambient after said step of exposing said substrate to said first atmosphere such that another oxide layer forms on said substrate, and removing said other oxide layer during said step of applying laser radiation against said substrate in the presence of said second atmosphere.

3. A method of epitaxially growing single crystalline silicon on a silicon substrate from a silicon-bearing gas at a temperature below the pyrolytic threshold of said silicon-bearing gas, comprising:

providing a silicon substrate exposed to ambient to have an oxide layer thereon;

fluorinating said substrate to replace silicon-oxide bonds with silicon-fluorine bonds and provide an adsorbed fluorinated layer;

exposing said substrate to a hydrogen atmosphere and applying laser radiation against said substrate to break said silicon-fluorine bonds and remove the fluorinated layer and replace them with silicon-hydrogen bonds;

without exposing said substrate to ambient, exposing said substrate to a silicon-bearing gas and heating said substrate to a given temperature below the pyrolytic threshold of said silicon-bearing gas and applying laser radiation against said substrate to break said silicon-hydrogen bonds and replace them with silicon-silicon bonds to epitaxially grow single crystalline silicon on said substrate;

after said fluorination step, exposing said substrate to ambient to form another oxide layer thereon, and, during said step of exposing said substrate to said hydrogen atmosphere and applying laser radiation, removing said other oxide layer to substrate to ambient, continuing said process by exposing said substrate to said silicon-bearing gas.

4. The invention according to claim 3 wherein said silicon-bearing gas is disilane, and said given temperature is in the range of about 500° C.–650° C.

5. The invention according to claim 3 comprising performing said last two mentioned steps in a vacuum at sub-UHV levels in the range of about $10^{-3}$ to $10^{-7}$ Torr.

6. A method for epitaxially growing single crystalline silicon on a silicon substrate from disilane $Si_2H_6$ at a temperature below the pyrolytic threshold of disilane, comprising:

providing a silicon substrate exposed to ambient to have an oxide layer thereon

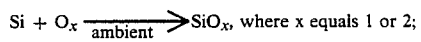

$Si + O_x \xrightarrow[ambient]{} SiO_x$, where x equals 1 or 2;

fluorinating said substrate in hydrogenfluoride to remove the oxide layer and substitute therefore fluorine atoms bonding with silicon atoms in the substrate and forming a fluorinated layer

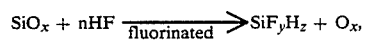

$SiO_x + nHF \xrightarrow[fluorinated]{} SiF_yH_z + O_x$, where y and z equal 1, 2, 3 or fractions thereof;

exposing said substrate to ambient such that another oxide layer forms thereon

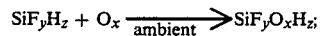

applying laser radiation against said substrate in the presence of hydrogen gas such that photolytic excitation removes said other oxide layer and breaks the silicon-fluorine bond and removes the fluorinated layer, and hydrogen is substituted for the fluorine to provide a silicon-hydrogen bond and hydrogen-fluoride

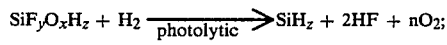

without exposing said substrate to ambient, heating said substrate and applying laser radiation against said substrate in the presence of disilane such that combined thermal and photolytic excitation breaks the silicon-hydrogen bonds and such that the disilane decomposes to silane and unstable $SiH_z$ which in turn decomposes to hydrogen and atomic silicon, which atomic silicon bonds with now unbonded silicon atoms in said substrate to epitaxially grow single crystalline silicon thereon

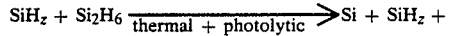

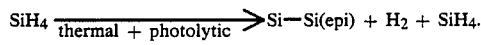

7. The invention according to claim 6 comprising during said step of applying laser radiation against said substrate in the presence of hydrogen gas, also heating said substrate such that combined thermal and photolytic excitation removes said other oxide layer and breaks the silicon-fluorine bond, and hydrogen is substituted for the fluorine to provide a silicon-hydrogen bond and hydrogen-fluoride

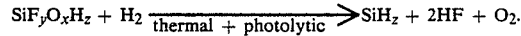

8. The invention according to claim 6 wherein said substrate is heated to a temperature in the range of about 500° C.–650° C.

9. The invention according to claim 6 comprising performing said last two mentioned steps in a vacuum at sub-UHV levels in the range of about $10^{-3}$ to $10^{-7}$ Torr.

* * * * *